United States Patent [19]

Ueda et al.

[11] Patent Number: 4,847,514

[45] Date of Patent: Jul. 11, 1989

[54] LIGHT-ACTUATED SUPERCONDUCTING INTEGRATED CIRCUIT DEVICE

[75] Inventors: Kimio Ueda; Hideki Andou, both of Itami, Japan

[73] Assignee: Mitsubishi Denki Kabushiki Kaisha, Japan

[21] Appl. No.: 156,898

[22] Filed: Feb. 17, 1988

[30] Foreign Application Priority Data

Aug. 20, 1987 [JP] Japan .................................. 62-207015

[51] Int. Cl.⁴ .................... H03K 17/92; H03K 19/195
[52] U.S. Cl. .................................... 307/245; 307/306; 307/311; 307/476
[58] Field of Search ............... 307/245, 476, 462, 277, 307/306, 311; 357/5

[56] References Cited

U.S. PATENT DOCUMENTS 3,956,727 5/1976 Wolf ................................... 307/306

OTHER PUBLICATIONS

J. L. Anderson, "Light Responsive Cryogenic Storage Unit", IBM Tech. Discl. Bulletin, vol. 6, No. 10, Mar. 1964, p. 40-1.
Journal of Japanese Electronics and Communication Society, '86/9, vol. J69-C No. 9.

Primary Examiner—John Zazworsky
Attorney, Agent, or Firm—Leydig, Voit & Mayer

[57] ABSTRACT

A superconducting integrated circuit device switches the state of a Josephson junction element in response to incident light by diverting a current to a superconducting control signal line from a superconducting control signal extracting line. The control signal extracting line becomes resistive when irradiated by a light.

6 Claims, 3 Drawing Sheets

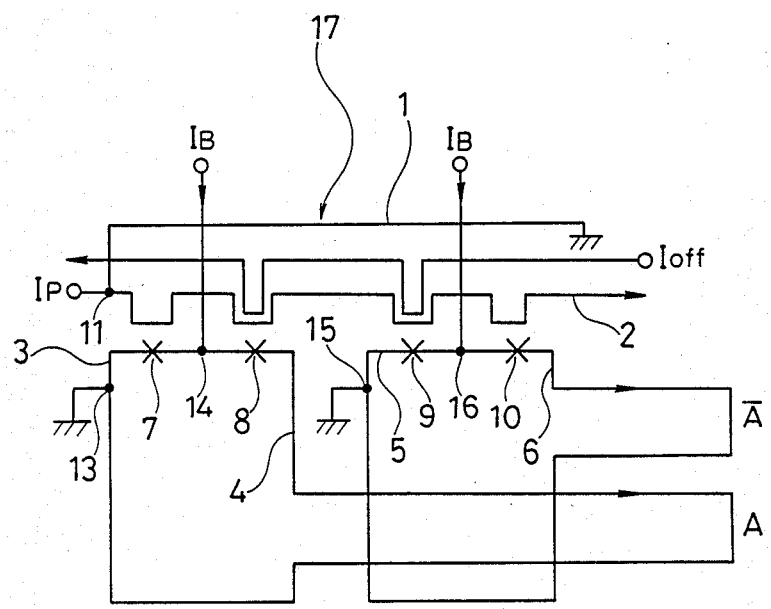
F I G .1.

LIGHT-ACTUATED SUPERCONDUCTING INTEGRATED CIRCUIT DEVICE

FIELD OF THE INVENTION

The present invention relates to a superconducting integrated circuit device controlled by a light signal.

BACKGROUND ART

FIG. 2 shows a construction of an address buffer circuit as a prior art superconducting integrated circuit device. In FIG. 2, the reference numerals 7, 8, 9, and 10 designate Josephson junction elements, the numerals 13, 14, 15, and 16 designate connection nodes, and the numerals 3, 4, 5, and 6 designate superconducting strip lines connected between the connection nodes.

The operation of the device will be described with reference to operation waveforms of FIG. 3.

The inductance of the strip line 3 is significantly lower than the inductance of the strip line 4, and similarly the inductance of the strip line 5 is significantly lower than that of the strip line 6. When a DC bias current $I_B$ is applied in this state, almost all of the current $I_B$ flows through lines 3 and 5 including to ground through Josephson junction elements 7 and 9 of the ratio of inductances of lines 3 to 4 and lines 5 to 6, respectively. An off-set signal $I_{off}$ is applied in a reverse direction from that of an address signal $I_C$. These signals affect the state of the Josephson junction elements because of their proximity. The signals flow through superconducting strip lines as indicated in FIG. 2. The explanation of the switching behavior of the device of FIG. 2 is based on the application of the signals shown in FIG. 3 while a constant biasing signal $I_B$ is applied. The offset current $I_{off}$ is also constant in direction and amplitude. The address signal $I_C$ is pulsed.

When an address signal $I_C$ is applied, the Josephson junction element 7 is switched so that most of the biasing current flows through strip line 4 to output a "1" signal to output A. On the other hand, the Josephson junction element 9 is not switched because the off-set signal $I_{off}$ and the address signal $I_C$ cancel each other. Accordingly, $\overline{A}$="0" is output. When the address signal $I_C$ is inverted in this state, the Josephson junction elements 8 and 9 are switched, and A="0", $\overline{A}$="1" are output. This prior art device uses non-latching states of the switching gates, and in this way the address signal $I_C$ is directed to A and $\overline{A}$.

The prior art superconducting integrated circuit device is a current control, and it was difficult to introduce the it into a light information processing system and light communication system.

SUMMARY OF THE INVENTION

An object of the present invention is to provide a superconducting integrated circuit device of high efficiency for use in a light information processing system and a light communication system.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a present invention, there is provided a superconducting integrated circuit device which comprises a Josephson junction element which is switched by a current flowing through a control signal line, the control signal line being a superconducting strip line connected to a terminal to which a control current is applied and a control signal extracting line which changes from a superconducting state to an ordinary conducting state upon irradiation by a light signal, the extracting line being a superconductor strip line connected to a terminal to which the control current is applied.

BRIEF DESCRIPTION OF THE DRAWINGS

FIG. 1 is a diagram showing a superconductor integrated circuit device as an embodiment of the present invention;

DETAILED DESCRIPTION OF THE PREFERRED EMBODIMENTS

Figure 2:
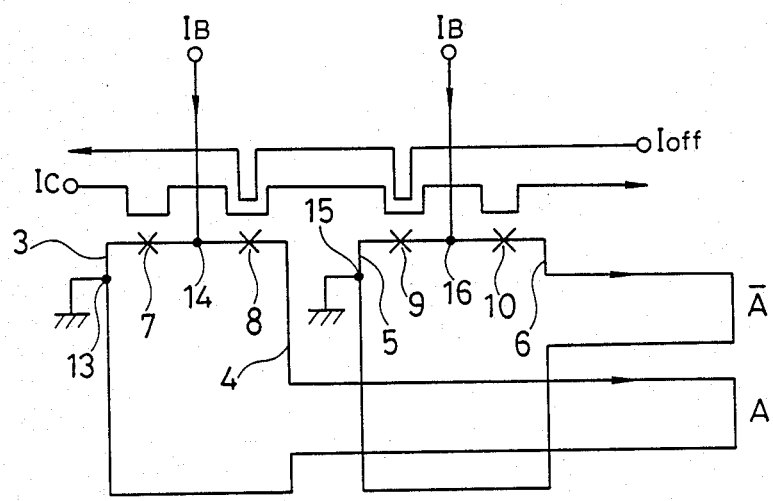
FIG. 2 is a diagram showing a prior art superconductor integrated circuit device.
Figure 3:
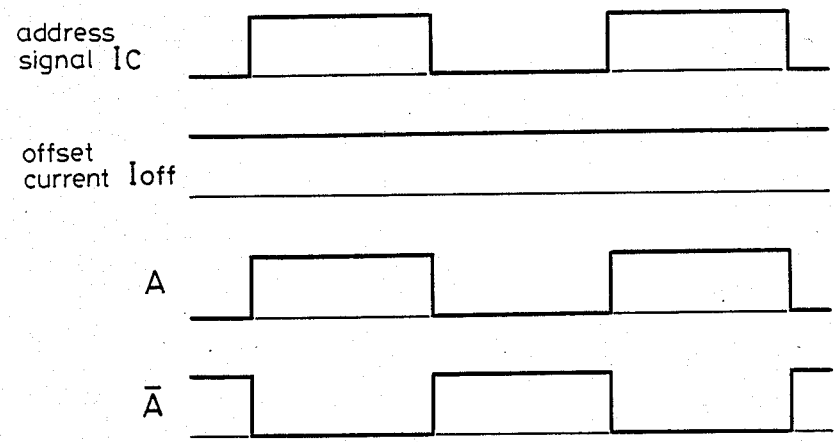
FIG. 3 is a diagram showing signal waveforms for exemplifying the operation of the prior art device.

In order to explain the present invention in detail, reference will be particularly made to FIG. 1.

FIG. 1 shows a superconductor integrated circuit device as an embodiment of the present invention. In FIG. 1, the reference numerals 7, 8, 9, and 10 designate Josephson junction elements. The numerals 11, 13, 14, 15, and 16 designate connection nodes. The numeral 3 designates a supeconducting strip line including the Josephson junction element 7 disposed between the nodes 13 and 14. The numeral 4 designates a superconducting strip line including the Josephson junction element 8 disposed between the nodes 13 and 14. The numeral 5 designates a superconducting strip line including the Josephson junction element 9 disposed between the nodes 15 and 16. The numeral 6 designates a superconducting strip line including the Josephson junction element 10 disposed between the nodes 15 and 16. The numeral 1 designates a superconducting strip line irradiated by a light pulse 17. The numeral 2 designates a superconducting strip line for controlling the Josephson junction elements 7 to 10.

The operation of the device will be described with reference to operation waveforms of FIG. 4.

The inductance of the strip line 3 is significantly lower than that of the strip line 4, and similarly the inductance of the strip line 5 is significantly lower than that of the strip line 6. The inductance of the strip line 1 is significantly lower than that of the strip line 2. When a DC bias current $I_B$ is applied in this state, almost all of the current $I_B$ flows through lines including the Josephson junction elements 7 and 9 based on the ratio of inductances. When a control current $I_P$ is applied similarly as above, almost all of the current $I_P$ flows through superconducting strip line 1. The off-set circuit $I_{off}$ is applied in the reverse direction from that of the control current $I_P$. These constant current signals are shown in FIG. 4. In addition, FIG. 4 also shows light pulses 17 that periodically irradiate superconducting strip line 1.

When a light pulse signal 17 irradiates superconducting strip line 1, the irradiated region changes from the superconducting state to the ordinary conducting state, thereby becoming resistive. When strip line 1 becomes resistive, the control current $I_P$ that flows directly to ground through strip line 1 when that line has no resistance, flows through the superconducting strip line 2. The flow of control current $I_P$ through strip line 2 proximate the Josephson junction element 7 and switches the state of junction element 7 so that current $I_B$ flows through the strip line 4 including the Josephson junction element 8. As a result, a "1" signal is output to A. The state of the Josephson junction element 9 is not switched by the flow of current $I_P$ through strip line 2 because the off-set current $I_{off}$ and the control current $I_P$ are of opposite sense and their effects cancel each other. However, the Josephson junction 10 is switched when current $I_P$ flows through strip line 2. Accordingly, $\overline{A}$="0" is output.

Figure 4:
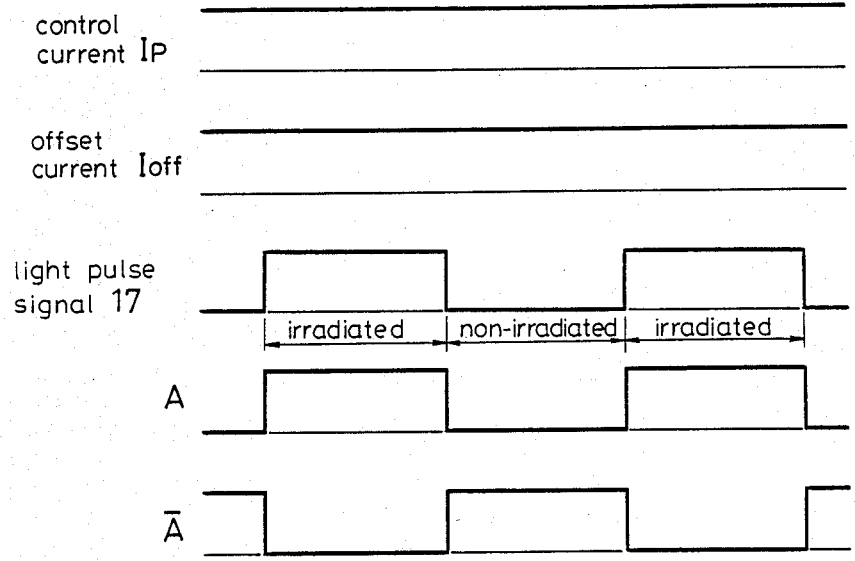
FIG. 4 is a diagram showing signal waveforms for exemplifying the operation of the device of the present invention.

When the radiation of strip line 1 with light pulse signal 17 ends, i.e., between the pulses in FIG. 4, the control current $I_P$ is instantly switched to from strip line 2 the strip line 1 because the current paths are determined by the ratio of inductances. The Josephson junction elements 8 and 9 are also switched back to their original state when current $I_P$ ceases to flow through strip line 2 so that currents instantly flow through the strip lines 3 and 6 (that is, non-latching operations are carried out). A="0" and $\overline{A}$="1" are output.

In the address buffer circuit of the present embodiment the logical base of A="1" (and $\overline{A}$="0") or A="0" (and $\overline{A}$="1") dependent on whether a light signal normally irradiates line 1. Furthermore, as this circuit is non-latching, a logic signal output is produced after instantly a light signal is produced.

As is evident from the foregoing description, according to the present invention, a superconducting integrated circuit device is controlled by a light pulse signal whereby a high efficiency superconducting integrated circuit device capable of introduction into a light information processing system and a light communication system is obtained.

What is claimed is:

1. A light-actuated superconducting integrated circuit device comprising:
    a Josephson junction element;
    a superconducting control signal line disposed proximate said Josephson junction device for carrying a control current that switches the state of said Josephson junction element when flowing in said control signal line; and
    a superconducting control signal extracting line for extracting said control current from said control signal line only when said control signal extracting line is superconducting, said control signal extracting line becoming resistive upon irradiation by a light signal whereby said control current flows in said control signal line and the state of said Josephson junction element is switched.

2. The device of claim 1 wherein said Josephson junction element does not latch upon switching of its state.

3. The device of claim 1 wherein said control signal line has a larger inductance than said control signal extracting line.

4. A light-actuated superconducting integrated circuit device comprising:
    first and second Josephson junction elements respectively disposed in first and second superconductor strip lines of relatively low and high inductance, respectively;
    third and fourth Josephson junction elements respectively disposed in third and fourth superconductor strip lines of relatively low and high inductance, respectively;
    a superconducting control signal line disposed proximate said first and fourth Josephson junction elements for carrying a control current that switches the state of said first and fourth Josephson junction elements when flowing in said control signal line;
    a superconducting offset signal line disposed proximate said second and third Josephson junction elements for carrying an offset current opposite in direction from said control current for switching said second and third Josephson junction elements; and
    a superconducting control signal extracting line for extracting said control current from said control signal line only when said control signal extracting line is superconducting, said control signal extracting line becoming resistive upon irradiation by a light signal whereby said control current flows in said control signal line and the state of said first and fourth Josephson junction element is switched.

5. The device of claim 4 wherein said Josephson junction elements do not latch upon switching of their states.

6. The device of claim 4 wherein said control signal line has a larger inductance than said control signal extracting line.

* * * * *